(12) United States Patent
Imada

(10) Patent No.: US 9,882,525 B2
(45) Date of Patent: Jan. 30, 2018

(54) SOLAR BATTERY MODULE

(71) Applicant: Panasonic Intellectual Property Management Co., Ltd., Osaka-shi, Osaka (JP)

(72) Inventor: Naoto Imada, Osaka (JP)

(73) Assignee: PANASONIC INTELLECTUAL PROPERTY MANAGEMENT CO., Ltd., Osaka-shi (JP)

(*) Notice: Subject to any disclaimer, the term of this patent is extended or adjusted under 35 U.S.C. 154(b) by 0 days.

(21) Appl. No.: 15/468,341

(22) Filed: Mar. 24, 2017

(65) Prior Publication Data

US 2017/0201209 A1 Jul. 13, 2017

Related U.S. Application Data

(63) Continuation of application No. PCT/JP2015/003378, filed on Jul. 6, 2015.

(30) Foreign Application Priority Data

Sep. 29, 2014 (JP) .................................. 2014-198374

(51) Int. Cl.
*H01L 31/048* (2014.01)
*H02S 40/22* (2014.01)
(Continued)

(52) U.S. Cl.
CPC .......... *H02S 40/22* (2014.12); *H01L 31/0488* (2013.01); *H01L 31/0504* (2013.01); *H02S 30/10* (2014.12)

(58) Field of Classification Search
CPC . H01L 31/0488; H01L 31/0504; H02S 40/22; H02S 30/10
See application file for complete search history.

(56) References Cited

U.S. PATENT DOCUMENTS 4,235,643 A * 11/1980 Amick .................. H01L 31/048
136/246
5,076,857 A * 12/1991 Nowlan ................ H01L 31/048
136/256

(Continued)

FOREIGN PATENT DOCUMENTS

EP    2 752 890 A1    7/2014
JP    2001-148500 A    5/2001
(Continued)

OTHER PUBLICATIONS

International Search Report dated Sep. 15, 2015, issued in counterpart International Application No. PCT/JP2015/003378 (1 page).

(Continued)

*Primary Examiner* — Golam Mowla
(74) *Attorney, Agent, or Firm* — Westerman, Hattori, Daniels & Adrian, LLP

(57) ABSTRACT

Provided is a solar battery module having an outer edge maintained by a frame, and comprising a group of strings formed by using a plurality of solar battery cells, connecting adjacent solar battery cells in a longitudinal direction by an inter-cell wiring material to form a plurality of strings, and arranging the plurality of strings in a transverse direction, wherein a spacing distance A between the interior of the frame and the frame-side edge of solar battery cells of the outermost string in the group of strings, a spacing distance B between solar battery cells constituting adjacent strings in the group of strings, and a spacing distance C between the solar battery cells in the transverse direction satisfy the relationship $\{(995A-20C)/1005\}<B<\{(1005A+20C)/995\}$. Additionally, an olefinic resin is used in a first sealing member on the light receiving surface side.

4 Claims, 3 Drawing Sheets

(51) Int. Cl.
*H02S 30/10* (2014.01)
*H01L 31/05* (2014.01)

(56) References Cited

U.S. PATENT DOCUMENTS

| | | | | |
|---|---|---|---|---|
| 5,554,229 | A * | 9/1996 | Vogeli | H01L 31/022425 136/256 |
| 5,994,641 | A | 11/1999 | Kardauskas | |
| 6,008,449 | A * | 12/1999 | Cole | H01L 31/048 136/246 |
| 6,323,415 | B1 * | 11/2001 | Uematsu | B32B 17/10018 136/246 |
| 6,365,823 | B1 * | 4/2002 | Kondo | H01L 31/0236 136/246 |
| 6,384,318 | B1 * | 5/2002 | Nomura | H01L 31/0236 136/246 |
| 6,410,843 | B1 | 6/2002 | Kishi et al. | |
| 7,238,878 | B2 * | 7/2007 | Gonsiorawski | B32B 17/1033 136/244 |
| 7,419,377 | B1 * | 9/2008 | Briere | H01L 31/0508 439/32 |
| 9,385,251 | B2 * | 7/2016 | Choi | H01L 31/03044 |
| 9,425,340 | B2 * | 8/2016 | Taira | H01L 31/022425 |
| 2004/0035460 | A1 * | 2/2004 | Gonsiorawski | B32B 17/1033 136/251 |
| 2004/0200522 | A1 * | 10/2004 | Fukawa | H01L 31/022425 136/259 |
| 2005/0178431 | A1 * | 8/2005 | Yang | H01L 31/068 136/259 |
| 2007/0186968 | A1 * | 8/2007 | Nakauchi | H01L 31/022425 136/244 |
| 2007/0295381 | A1 * | 12/2007 | Fujii | H01L 31/022433 136/244 |
| 2008/0000517 | A1 * | 1/2008 | Gonsiorawski | B32B 17/10018 136/246 |
| 2008/0121266 | A1 * | 5/2008 | Tsunomura | H01L 31/0747 136/244 |
| 2009/0223562 | A1 * | 9/2009 | Niira | H01L 31/1804 136/256 |
| 2010/0108141 | A1 * | 5/2010 | Fukushima | C09J 5/06 136/256 |
| 2011/0048492 | A1 * | 3/2011 | Nishiwaki | H01L 31/0504 136/244 |
| 2011/0100425 | A1 * | 5/2011 | Osamura | H01L 31/048 136/246 |
| 2013/0213469 | A1 * | 8/2013 | Kramer | H01L 31/022458 136/256 |
| 2014/0202534 | A1 | 7/2014 | Ichinose et al. | |
| 2016/0126387 | A1 * | 5/2016 | Hashimoto | H01L 31/0201 136/244 |

FOREIGN PATENT DOCUMENTS

| | | |
|---|---|---|
| JP | 2010-182851 A | 8/2010 |
| WO | 2013/069680 A1 | 5/2013 |

OTHER PUBLICATIONS

Extended (supplementary) European Search Report dated Sep. 19, 2017, issued in counterpart European Application No. 15845914.9. (6 pages).

* cited by examiner

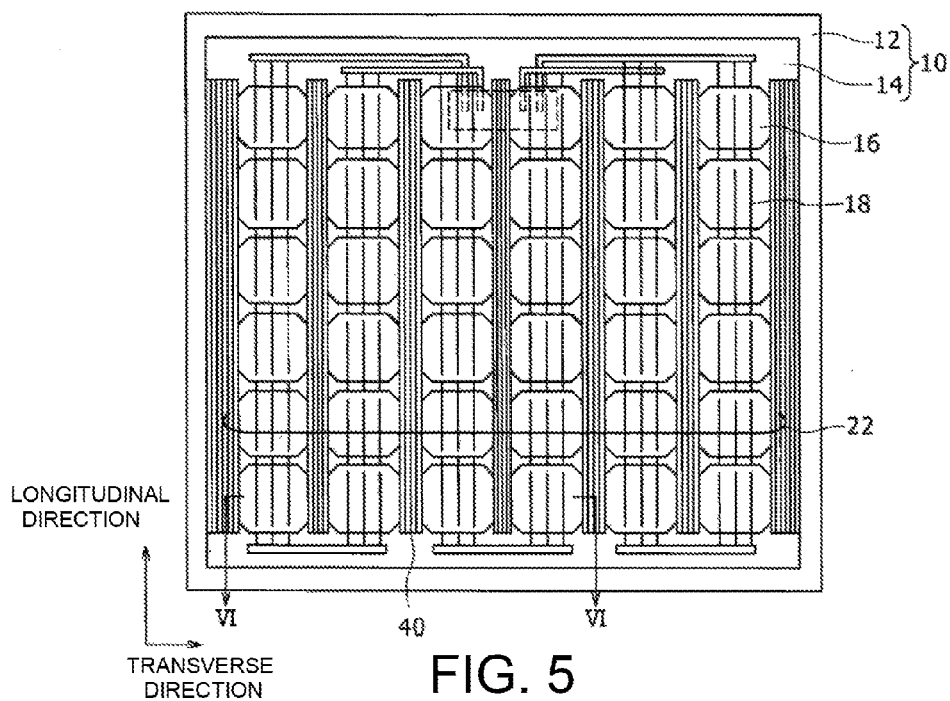
LONGITUDINAL DIRECTION
TRANSVERSE DIRECTION
FIG. 5
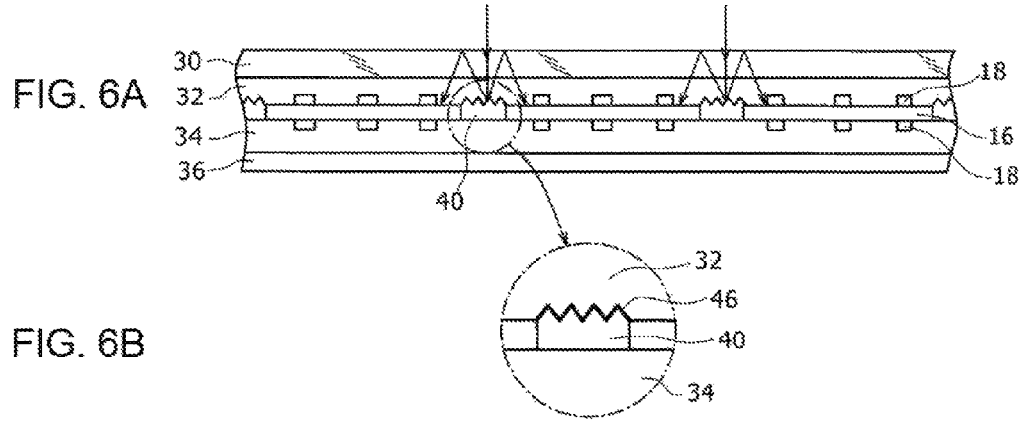
FIG. 6A
FIG. 6B

SOLAR BATTERY MODULE

CROSS-REFERENCE TO RELATED APPLICATION

The present application is a continuation under 35 U.S.C. § 120 of PCT/JP2015/003378, filed Jul. 6, 2015, which is incorporated herein by reference and which claimed priority to Japanese Patent Application No. 2014-198374 filed Sep. 29, 2014. The present application likewise claims priority under 35 U.S.C. § 119 to Japanese Patent Application No. 2014-198374 filed Sep. 29, 2014, the entire content of which is also incorporated herein by reference.

TECHNICAL FIELD

The present disclosure relates to a solar cell module.

BACKGROUND ART

Patent Literature 1 discloses a structure using, in a solar cell module, a transparent olefin-based resin as a sealant on the side of a light receiving surface, and an ethylene-vinyl acetate copolymer, including a white pigment such as titanium dioxide, as a sealant on the side of a rear surface.

CITATION LIST

Patent Literature

Patent Literature 1: International Publication No. WO 2013/069680

SUMMARY OF INVENTION

Technical Problem

The technical problem to be solved by the present disclosure is to make short-circuit current values uniform for a plurality of solar cells arranged transversely and longitudinally in a solar cell module.

Solution to Problem

The solar cell module according to an aspect of the present disclosure includes a stack body, and a frame holding the outer edges of the stack body, wherein the stack body is formed by laminating a first protection member on the side of a light receiving surface, a first sealing member on the side of the light receiving surface, a string group formed by transversely arranging a plurality of strings each formed by using a plurality of solar cells, and by longitudinally connecting the adjacent solar cells to each other with a wiring member, a second sealing member on the side of the rear surface and a second protection member on the side of the rear surface, in the mentioned order; wherein there are provided, between the adjacent solar cells, reflection members reflecting the incident light and again making the reflected light incident on the light receiving surface of the solar cells; the first sealing member is constituted with an olefin-based resin; and the spacing dimension A between the frame side edge of the outermost string in the string group and the frame inside, the spacing dimension B between the adjacent strings in the string group, and the transverse spacing dimension C of the solar cells satisfy a relation $\{(995A-20C)/1005\} < B < \{(1005A+20C)/995\}$.

Advantageous Effects of Invention

According to the above-described constitution, the difference between the spacing dimension B and the spacing dimension A falls within a predetermined range, and hence the short-circuit current value difference due to the difference between the spacing dimension B and the spacing dimension A is reduced, and in the solar cell module, it is possible to make the short-circuit current value for the plurality of solar cells arranged transversely and longitudinally uniform.

BRIEF DESCRIPTION OF DRAWINGS

FIG. 5 is a diagram illustrating the configuration of the solar cell module of another embodiment.

FIGS. 6A and 6B are sectional views along the line VI-VI in FIG. 5, in which FIG. 6A is a view corresponding to FIG. 3, and FIG. 6B is a partial enlarged view.

DESCRIPTION OF EMBODIMENTS

Hereinafter, with reference to the accompanying drawings, the embodiments of the present disclosure are described in detail. The below-described material qualities, thicknesses, dimensions, number of solar cells, number of strings and others are examples for describing the embodiments, and can be appropriately modified according to the specifications of solar cell modules. Hereinafter, in all the drawings, the same symbols are allotted to the corresponding elements, and duplicate descriptions are sometimes omitted.

Figure 1:
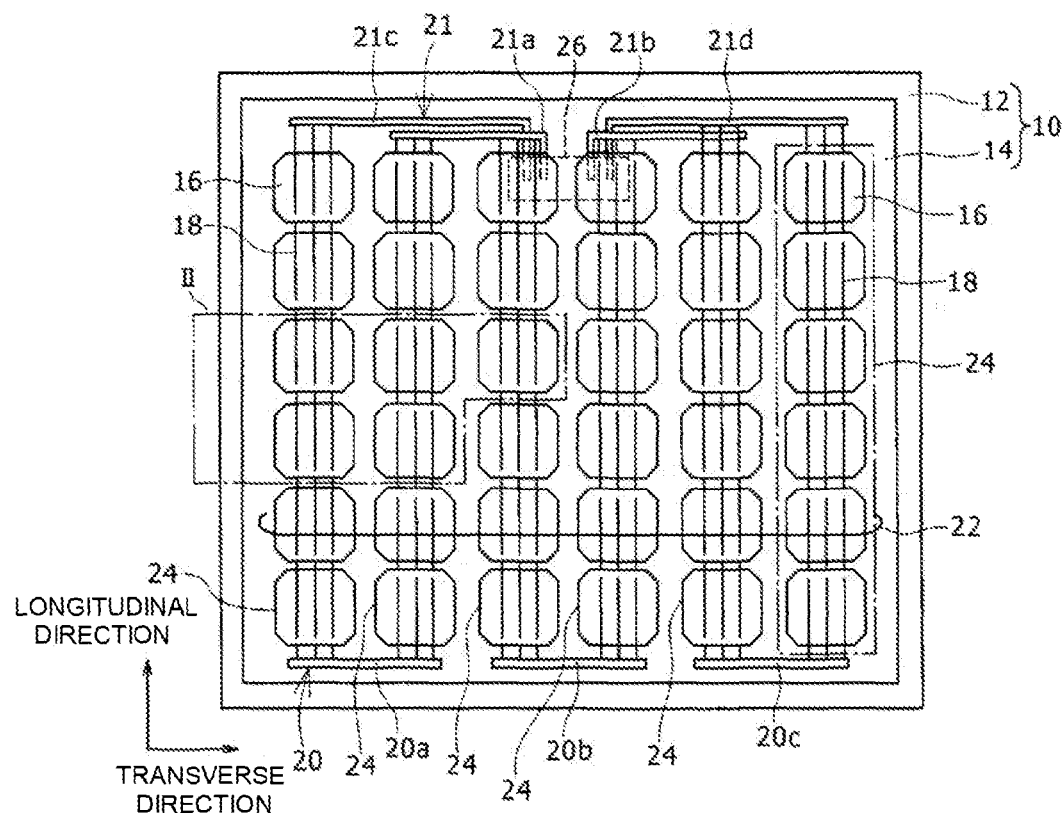
FIG. 1 is a diagram illustrating the configuration of the solar cell module of an embodiment according to the present disclosure.
Figure 2:
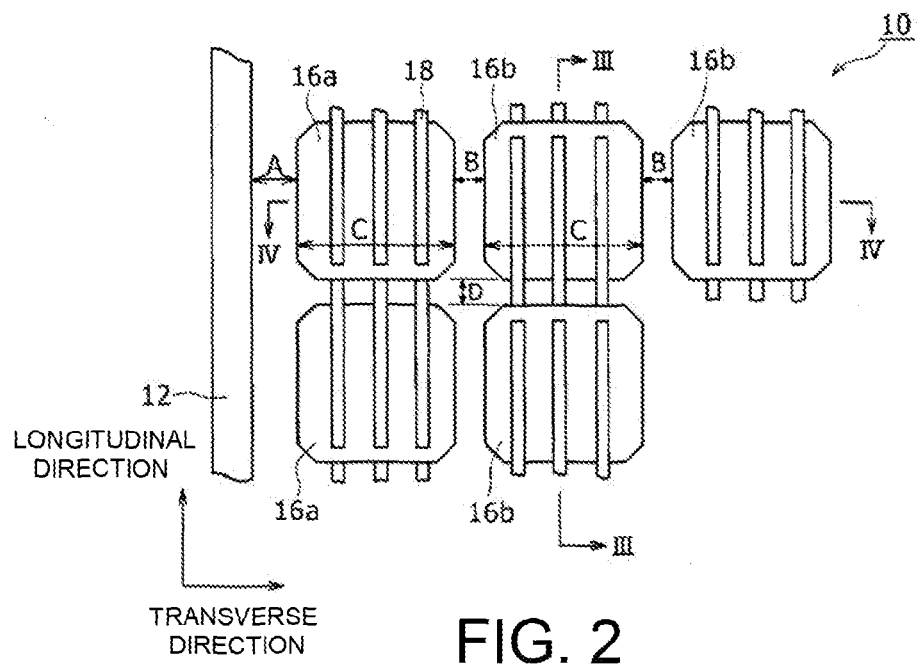
FIG. 2 is an enlarged diagram of the portion II in FIG. 1.
Figure 3:
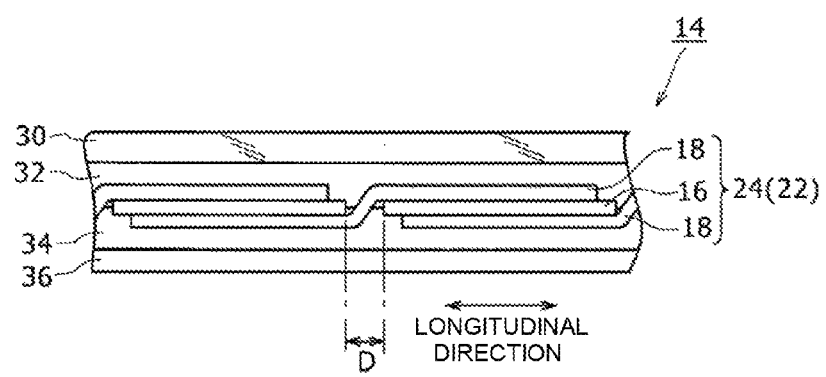
FIG. 3 is a sectional view along the line III-III in FIG. 2.
Figure 4:
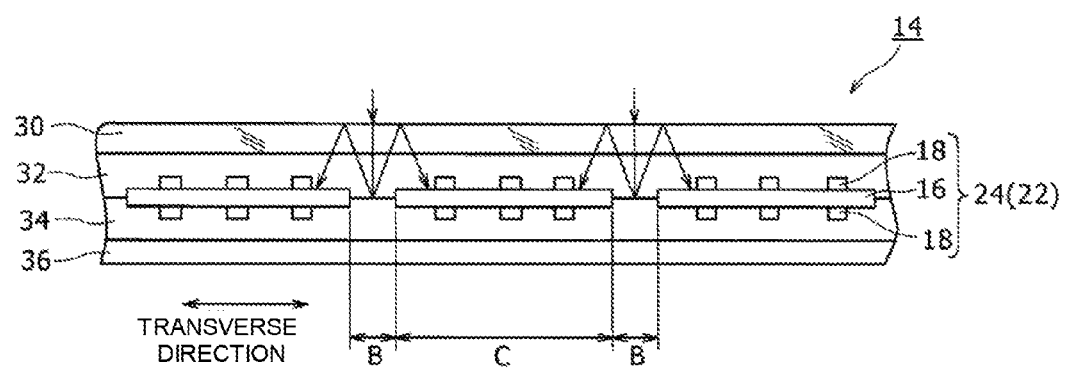
FIG. 4 is a sectional view along the line IV-IV in FIG. 2.

FIG. 1 is a plan diagram illustrating the configuration of a solar cell module 10. FIG. 2 is an enlarged diagram of the portion marked with II in FIG. 1. FIG. 3 is a sectional view along the line III-III in FIG. 2, and FIG. 4 is a sectional view along the line IV-IV in FIG. 2.

The solar cell module 10 includes a stack body 14 and a frame 12 holding the edges of the stack body 14. The stack body 14 is formed as follows: a plurality of solar cells 16 are arranged transversely and longitudinally on a plane, the string group 22 is formed by serially connecting the plurality of solar cells 16 with an inter-cell wiring member 18 and connection wiring members 20 and 21, the string group 22 is sandwiched between a set of the sealant and the protection member on the side of the light receiving surface and another set of the sealant and the protection member on the side of the rear surface, and thus the stack body 14 is formed.

Here, the longitudinal direction is the extending direction of the inter-cell wiring member 18, and the transverse direction is the extending direction of the connection wiring member 20. FIG. 1 shows the longitudinal direction and the transverse direction.

The string groups 22 are described, and then, the set of the sealant and the protection member on the side of the light receiving surface and the set of the sealant and the protection member on the side of the rear surface, sandwiching the string groups 22 will be described in terms of contents with reference to FIG. 3 and FIG. 4.

The string group 22 is constituted with a plurality of strings 24 connected to each other with the connection wiring member 20. A plurality of strings 24 are transversely arranged with predetermined spacings. In the example of FIG. 1, the string group 22 is constituted by six strings 24.

In the string 24, a plurality of solar cells 16 are arranged so as to be longitudinally connected to each other with an inter-cell wiring member 18. In the example of FIG. 1, the string 24 is constituted with six of the solar cells 16.

The solar cell 16 is provided with a photoelectric conversion part generating a carrier by receiving solar light. The photoelectric conversion part has, as the electrodes collecting the generated carriers, a light receiving surface electrode formed on the light receiving surface of the photoelectric conversion part, and a rear surface electrode formed on the rear surface. In each of the drawings, the diagrammatic representation of the light receiving surface electrode and the rear surface electrode is omitted. The structure of the solar cell 16 is not limited to such a structure as described above, and may be a structure with the electrodes formed only on the side of the rear surface of the photoelectric conversion part. The rear surface electrode is preferably formed so as to have a larger area than the area of the light receiving surface electrode. In this case, in the solar cell 16, the surface having a larger electrode area, or the surface with the electrode to be formed so as to have a larger area, is the rear surface.

The photoelectric conversion part has a semiconductor substrate such as a crystalline silicon (c-$S_i$) substrate, a gallium arsenide (GaAs) substrate, or an indium phosphide (InP) substrate, an amorphous semiconductor layer formed on the semiconductor substrate, and a transparent conductive layer formed on the amorphous semiconductor layer. Here a structure is used in which an i-type amorphous silicon layer, a p-type amorphous silicon layer and a transparent conductive layer are laminated in this order on one surface of an n-type single crystalline silicon substrate. The transparent conductive layer uses a transparent conductive oxide prepared by doping tin (Sn) or antimony (Sb) in a film of metal oxide such as indium oxide ($In_2O_3$) or zinc oxide (ZnO).

The inter-cell wiring member 18 is constituted with two types of wiring members. Of the plurality of solar cells 16 constituting the string 24, in the continuously arranged solar cells 16 of a first solar cell, a second solar cell and a third solar cell, adjacent to each other, one type of wiring member of two types of wiring members connect the light receiving surface electrode of the second solar cell and the rear surface electrode of the first solar cell to each other. Another type of wiring member connects the rear surface electrode of the second solar cell and the light receiving surface electrode of the third solar cell to each other. By repeating this connection, the plurality of the solar cells 16 are serially connected to each other. One solar cell 16 is put between the inter-cell wiring member 18 connected to the light receiving surface electrode and the inter-cell wiring member 18 connected, separately and independently from the foregoing inter-cell wiring member, to the rear surface electrode. In the example shown in FIG. 1, three inter-cell wiring members 18 are used on each of the light receiving surface and the rear surface of the solar cell 16.

For the inter-cell wiring member 18, a thin plate constituted with a metal conductive material such as cooper is used. In place of the thin plate, a twisted wire wiring member can also be used. As the conductive material, in addition to copper, silver, aluminum, nickel, tin, gold or alloys of these can be used.

An adhesive is used in the connection between the inter-cell wiring member 18 and the light receiving surface electrode and the connection between the inter-cell wiring member 18 and the rear surface electrode. As the adhesive, it is possible to use a thermosetting resin adhesive such as an acrylic adhesive, a polyurethane-based adhesive having high flexibility, or an epoxy-based adhesive. The adhesive includes conductive particles. As the conductive particles, it is possible to use nickel particles, silver particles, gold-coated nickel particles, tin-plated copper particles and the like. As the adhesive, it is also possible to use an insulating resin adhesive. For example, in the case of the light receiving surface of the solar cell 16, one or both of the mutually facing surfaces of the inter-cell wiring member 18 and the light receiving surface electrode are made concave-convex, the resin is removed from between the inter-cell wiring member 18 and the light receiving surface electrode to form a region bringing the inter-cell wiring member 18 and the light receiving surface electrode into direct contact with each other, and thus the inter-cell wiring member 18 and the light receiving surface electrode are electrically connected.

The connection wiring members 20 and 21 are the wiring members connecting between the mutually adjacent strings 24, in a plurality of strings 24 arranged transversely. As the material for the connection wiring members 20 and 21, any of the materials described for the inter-cell wiring member 18 can be used. The connection wiring members 20 and 21 are disposed, outside the arrangement region of the plurality of the strings 24, on both longitudinal end sides of the plurality of the strings 24. The connection wiring member 20 is disposed on the longitudinal lower end side, and the connection wiring member 21 is disposed on the longitudinal upper end side.

In the example shown in FIG. 1, the string 24 disposed on the transversely most left side and the string 24 disposed at the second position as counted from the left are connected to each other with the connection wiring member 20a on the lower end side of FIG. 1.

The string 24 disposed second as counted from the left and the string 24 disposed third as counted from the left are connected to each other with the connection wiring member 21a on the upper end side of FIG. 1.

Hereinafter similarly, the string 24 disposed third as counted from the left and the string 24 disposed fourth as counted from the left are connected to each other with the connection wiring member 20b on the lower end side of FIG. 1. The string 24 disposed fourth as counted from the left and the string 24 disposed fifth as counted from the left are connected to each other with the connection wiring member 21b on the upper end side of FIG. 1. The string 24 disposed fifth as counted from the left and the string 24 disposed sixth as counted from the left are connected to each other with the connection wiring member 20c on the lower end side of FIG. 1.

With the three connection wiring members 20a, 20b and 20c on the lower end side and the two connection wiring members 21a and 21b, the six strings 24 are serially connected to each other to form a string group 22. Accordingly, the string group 22 is the (6×6)=36 solar cells 16 serially connected to each other. Across both ends of the 36 serially connected solar cells 16, a voltage of 36 times the terminal voltage of one solar cell 16 is output, and the currents flowing through the respective solar cells 16 constituting the string group 22 are the same current values as each other.

To the solar cell 16 on the upper most end side in the string 24 disposed on the most left side, one end of another connection wiring member 21c is connected, and the other end of the connection wiring member 21c is connected to one terminal of a terminal box 26 disposed on the rear side of the solar cell module 10. Similarly, to the solar cell 16 on the upper most end side in the string 24 disposed on the most right side, one end of a connection wiring member 21d is connected, and the other end of the connection wiring member 21d is connected to the other terminal of the terminal box 26. In FIG. 1, the wires drawn from the connection wiring members 21a and 21b are respectively connected to the terminal box 26, and these are used for detecting, for example, the intermediate voltage of the string group 22.

FIG. 2 is a diagram extracting five solar cells 16 in the portion surrounded by the frame marked with II in FIG. 1. Here, the solar cells 16 are distinguished from each other as follows: the solar cell disposed so as to be closest to the frame 12 is designated as the solar cell 16a, and the other solar cells disposed on the center side of the solar cell module 10 are designated as the solar cells 16b.

In FIG. 2, the spacing dimension A indicates the spacing dimension between the inside of the frame 12 and the frame side edge of the solar cell 16a. The spacing dimension A is measured along the transverse direction of the solar cell module 10. The inside of the frame 12 means the inside edge of the frame 12, namely, the inner edge of the frame 12. The frame side edge of the solar cell 16a means the outer edge, on the frame 12 side, of the solar cell 16a.

In FIG. 2, the spacing dimension B involves the solar cells 16b, and is the spacing dimension between a solar cell 16b and the solar cell 16a or the solar cell 16b adjacent to the mentioned solar cell 16b. B is the spacing dimension between the adjacent strings 24, and is measured along the transverse direction of the solar cell module 10. In the region involving the spacing dimension B, the inter-cell wiring member 18 is not disposed.

In contrast, the spacing dimension between the adjacent solar cells 16a in the same string 24, or the spacing dimension between the adjacent solar cells 16b in the same string 24 is represented by the spacing dimension D in FIG. 2. The spacing dimension D is a widthwise dimension along the longitudinal direction of the solar cell module 10. In the region involving the spacing dimension D, the inter-cell wiring member 18 is disposed.

In FIG. 2, the spacing dimension C is the width dimension of the solar cell 16 in the transverse direction.

In the spacing dimension B and the spacing dimension D, the spacing dimensions between the adjacent solar cells 16 are the spacing dimensions between the outer edges of the solar cells 16 facing each other. In the spacing dimension C, the transverse width dimension of the solar cell 16 is the spacing dimension between the outer edges of the two sides parallel to each other, along the longitudinal direction of one solar cell 16.

Before describing the relations between the spacing dimensions A, B, C and D, the thickness direction configuration of the solar cell module 10 will be described with reference to FIG. 3 and FIG. 4. FIG. 3 is a sectional view along the line III-III in FIG. 2, and a sectional view along the longitudinal direction in the stack body 14 of the solar cell module 10. FIG. 4 is a sectional view along the line IV-IV in FIG. 2, and a sectional view along the transverse direction in the stack body 14 of the solar cell module 10.

As shown in FIG. 3 and FIG. 4, the stack body 14 is formed by laminating a first protection member 30 on the side of the light receiving surface, a first sealing member 32 on the side of the light receiving surface, the string group 22, a second sealing member 34 on the side of the rear surface and a second protection member 36 on the side of the rear surface, in the mentioned order. FIG. 3 shows the section along the longitudinal direction of one string 24 in the string group 22, and FIG. 4 shows the section along the transverse direction of three strings 24 in the string group 22.

The first protection member 30 is a protection member on the side of the light receiving surface in the solar cell module 10, and is constituted with a transparent member in order to make light incident on the solar cell 16. As the transparent member, for example, a glass substrate, a resin substrate and a resin film may be quoted. In consideration of fire resistance, durability and others, it is preferable to use a glass substrate. The thickness of the glass substrate can be set to be approximately 1 to 6 mm.

The first sealing member 32 is a member playing a role of sealing the string group 22 including the solar cells 16 by filling the gap between the string group 22 including the solar cells 16 and the first protection member 30. When the first protection member 30 is a glass substrate, the first sealing member 32 is preferably a material capable of suppressing the elution of the alkali metal component such as Na from the glass substrate. Additionally, the first sealing member 32 is preferably a material not generating an acid such as acetic acid even when moisture enters from the outside of the solar cell module 10. As such a first sealing member 32, a resin is used that is low in moisture content and does not generate an acid such as acetic acid as a result of the reaction with moisture. For example, an olefin resin is used. As the olefin resin, for example, polyethylene and polypropylene can be used.

The second sealing member 34 is preferably a material diffusely reflecting the light incident from the side of the light receiving surface at the boundary with the first sealing member 32. The light diffusely reflected at the boundary with the first sealing member 32 is again made incident on the side of the light receiving surface of the solar cell 16. In the present embodiment, the interface of the second sealing member 34 with the first sealing member 32 serves as a reflection member reflecting the light incident between the adjacent solar cells and again making the reflected light incident on the light receiving surfaces of the solar cells. FIG. 4 shows what occurs in the above-described situation. The region capable of diffusely reflecting light in the boundary with the first sealing member 32 is the region where the upper surface of the second sealing member 34 is exposed between the adjacent solar cells 16. This corresponds to the region involving the spacing dimensions A, B and D in FIG. 2. FIG. 3 shows the region corresponding to the spacing dimension D, and FIG. 4 shows the region corresponding to the spacing dimension B. The region involving the spacing dimension A is both ends of FIG. 4, and here the diagrammatic representation of both ends is omitted. FIG. 4 also shows the spacing dimension C in the transverse direction of the solar cell 16.

As described above, the light incident from the side of the light receiving surface is reflected diffusely in the region involving the spacing dimensions A, B and D, and the diffusely reflected light is again made incident on the light receiving surface of the solar cells 16. Thus, the quantity of the incident light contributing to the photoelectric conversion can be increased, and the short circuit current value $I_{SC}$ that is a property of the solar cell module 10 can be increased.

As such a second sealing member 34, a pigment-containing resin can be used. As the pigment, a white pigment is preferable. As the white pigment, there can be used, for example, titanium dioxide, zinc oxide, white lead, zinc sulfide, barium sulfate, barium borate, calcium carbonate, magnesium oxide, antimony trioxide, zirconium oxide and aluminum oxide. As the resin, an olefin-based resin can be used, similarly to the case of the first sealing member 32, and ethylene-vinyl acetate copolymer (EVA) and polyvinyl butyral (PVB) can also be used.

The second protection member 36 is a protection member on the side of the rear surface in the solar cell module 10, and is not particularly required to have transparency. As such a second protection member 36, a resin film is used. The resin film may include a layer of a metal such as aluminum, or an inorganic layer formed of a material such as silica. The thickness of the resin can be approximately 50 to 300 μm.

The widths of the regions involving the spacing dimensions A, B and D are different from each other, and hence the extent of increase in the short circuit current values $I_{SC}$ in the 36 solar cells 16 constituting the string group 22 are different from each other. Because the string group 22 is constituted with the 36 serially connected solar cells 16, the effect of the increase in the short circuit current value $I_{SC}$ of the solar cell module 10 is limited by the amount of increment of the short circuit current value $I_{SC}$ of the solar cell 16 that has the smallest amount of increment of the short circuit current value $I_{SC}$ among the 36 solar cells 16. Consequently, for the 36 solar cells 16, the dimensions of the spacing dimensions A, B and D are required to be set in such a way that the increments of the short circuit current values $I_{SC}$ are made uniform.

The description again goes back to FIG. 2. In the region involving the spacing dimension D, the region in which the second sealing member 34 is exposed is narrowed by the inter-cell wiring members 18. Consequently, in order to achieve the increase of the short circuit current value $I_{SC}$ on the basis of the diffuse reflection in the region involving the spacing dimension D, the spacing dimension D is required to be set wider than the regions involving the spacing dimensions A and B. When the spacing of the spacing dimension D is widened, the inter-cell wiring member 18 is made longer, and the resistance value of the inter-cell wiring member 18 is increased. When the resistance value of the inter-cell wiring member 18 is increased, FF (Fill Factor), one of the properties of the solar cell module 10, is degraded. As described above, the spacing dimension D cannot be made large, and accordingly, here the relation D<B is adopted.

The relation between the spacing dimension A and the spacing dimension B is such that when the solar cell module 10 is constituted, in general, the relation A>B is frequently set. In this case, the quantity of the light diffusely reflected from the region involving the spacing dimension A is larger than the quantity of the light diffusely reflected from the region involving the spacing dimension B. Consequently, a magnitude distribution of the short circuit current value $I_{SC}$ is caused among the 36 solar cells 16 constituting the string group 22. In one example, the spacing dimension B is set to be approximately 2 to 3 mm, whereas the spacing dimension A is set to be approximately 5 to 8 mm. In this way, when the spacing dimension A is as large as three times the spacing dimension B, the increment of the short circuit current value $I_{SC}$ of the solar cell 16a becomes larger than the increment of the short circuit current value $I_{SC}$ of the solar cell 16b.

On the basis of the results of experiments, simulations and others, the relation between the spacing dimensions A and B was investigated in detail. According to the results of experiments, simulations and others, from the reflection property of the white member, the proportion of the light reflected diffusely and again made incident on the one side of the solar cell 16 is approximately 25% in relation to the light incident on the white member.

Thus, when the transverse width dimension of the solar cell 16 is set to be the spacing dimension C, the ratio between the short circuit current value $I_{SC}(A)$ of the solar cell 16a and the short circuit current value $I_{SC}(B)$ of the solar cell 16b is calculated as $[I_{SC}(B)/I_{SC}(A)]=\{1+(0.25\times 2B)/C\}/[1+\{0.25\times(A+B)\}/C]$.

Here, when the variation of $[I_{SC}(B)/I_{SC}(A)]$ is intended to fall within a variation of ±0.5%, the relation $0.995<[I_{SC}(B)/I_{SC}(A)]<1.005$ is required to be satisfied. By solving this expression, a relation $\{(995A-20C)/1005\}<B<\{(1005C+20C)/995\}$ is obtained. By setting the spacing dimensions A, B and C so as to satisfy this relation, the variation of the short circuit current value $I_{SC}$ between the solar cell 16a and the solar cell 16b can be made to fall within a range of ±0.5%.

In the above-description, in the region between the transversely adjacent solar cells 16, as the member diffusely reflecting the incident light, the second sealing member 34, namely, a white-pigment-containing resin is used. FIG. 5, FIG. 6A, and FIG. 6B are diagrams showing an example in which no restriction is set on the material of the second sealing member 34, and the reflection member 40 is used as the member diffusely reflecting the incident light. FIG. 5 is a plan view corresponding to FIG. 1. FIGS. 6A and 6B are sectional views along the line VI-VI in FIG. 5, in which FIG. 6A is a diagram corresponding to FIG. 3, and FIG. 6B is a partially enlarged diagram.

As shown in FIG. 5, the reflection member 40 is arranged along the longitudinal direction on the surface, on the side of the light receiving surface, of the portion of the second sealing member 34, exposed between the adjacent strings in the string group 22. In the embodiment shown in FIG. 5, the reflection member 40 serves as a reflection member reflecting the light incident on the adjacent solar cells and again making the reflected light incident on the light receiving surface of the solar cells. On the concave-convex surface of the reflection member 40, a thin metal film 46 is provided. For example, an aluminum thin film is attached by vapor deposition or the like. The reflection member 40 having the metal thin film 46 suppresses moisture diffusion from the second sealing member 34 to the first sealing member 32.

FIG. 6A shows the state in which the light incident on the reflection member 40 is reflected diffusely by the concave-convex shape covered with a metal thin film 46, and the diffusely reflected light is again made incident on the solar cell 16. In this way, by using the reflection members 40, the improvement of the short circuit current value $I_{SC}$ of the solar cell module 10 can be achieved, and the diffusion of the moisture from the second sealing member 34 to the first sealing member 32 can be suppressed.

REFERENCE SYMBOL LIST 10 solar cell module, 12 frame, 14 stack body, 16, 16a, 16b solar cell, 18 inter-cell wiring member, 20, 20a, 20b, 20c, 21, 21a, 21b, 21c, 21d connection wiring member, 22 string group, 24 string, 26 terminal box, 30 first protection member, 32 first sealing member, 34 second sealing member, 36 second protection member, 40 reflection member, 46 metal thin film.

The invention claimed is:

1. A solar cell module comprising a stack body, and a frame holding an outer edge of the stack body,
   wherein the stack body is formed by laminating, in the mentioned order, a first protection member on a side of a light receiving surface, a first sealing member on the side of the light receiving surface, a string group formed by transversely arranging a plurality of strings each formed by using a plurality of solar cells, and by longitudinally connecting adjacent solar cells of the plurality of solar cells to each other with a wiring member, a second sealing member on a side of a rear surface, and a second protection member on the side of the rear surface;

wherein there are provided, between the adjacent solar cells, reflection members reflecting the incident light and again making the reflected light incident on a light receiving surface of the plurality of solar cells;

the first sealing member is constituted with an olefin-based resin;

spacing dimension A between a frame side edge of an outermost string in the string group and inside of the frame, spacing dimension B between adjacent strings in the string group, and transverse spacing dimension C of each of the plurality of solar cells satisfy a relation $\{(995A-20C)/1005\}<B<\{(1005A+20C)/995\}$;

wherein each reflection member of the reflection members is constituted with a resin provided with, on the side of the light receiving surface, a reflection surface having recesses or protrusions parallel to the longitudinal direction, and each of the reflection members is arranged along the longitudinal direction on the surface, on the side of the light receiving surface, of the portion of the second sealing member, exposed between the adjacent strings in the string group.

2. The solar cell module according to claim 1, wherein the second sealing member is constituted with a white pigment.

3. The solar cell module according to claim 1, wherein the spacing dimension A is set to be 5 to 8 mm.

4. The solar cell module according to claim 1, wherein D<B, D representing spacing between longitudinally adjacent solar cells of the plurality of solar cells in a string of the string group.

* * * * *